United States Patent
Tsai et al.

(10) Patent No.: US 9,184,100 B2
(45) Date of Patent: Nov. 10, 2015

(54) SEMICONDUCTOR DEVICE HAVING STRAINED FIN STRUCTURE AND METHOD OF MAKING THE SAME

(75) Inventors: Teng-Chun Tsai, Tainan (TW);
Chun-Yuan Wu, Yun-Lin County (TW);
Chih-Chien Liu, Taipei (TW);
Chin-Cheng Chien, Tainan (TW);
Chin-Fu Lin, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 508 days.

(21) Appl. No.: 13/206,533

(22) Filed: Aug. 10, 2011

(65) Prior Publication Data

US 2013/0037886 A1  Feb. 14, 2013

(51) Int. Cl.
| | |
|---|---|
| *H01L 27/092* | (2006.01) |
| *H01L 21/84* | (2006.01) |
| *H01L 21/8238* | (2006.01) |
| *H01L 27/12* | (2006.01) |
| *H01L 29/10* | (2006.01) |

(52) U.S. Cl.
CPC ...... *H01L 21/845* (2013.01); *H01L 21/823821* (2013.01); *H01L 27/0924* (2013.01); *H01L 27/1211* (2013.01); *H01L 29/1054* (2013.01)

(58) Field of Classification Search
USPC .......... 438/154, 157, 164, 198; 257/351, 353, 257/E21.415, E29.275
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 2002/0011612 A1* | 1/2002 | Hieda | 257/262 |
| 2002/0011617 A1* | 1/2002 | Kubo et al. | 257/301 |
| 2004/0195624 A1 | 10/2004 | Liu | |
| 2004/0256647 A1* | 12/2004 | Lee et al. | 257/289 |
| 2005/0051825 A1 | 3/2005 | Fujiwara | |
| 2006/0057787 A1* | 3/2006 | Doris et al. | 438/153 |
| 2006/0099830 A1 | 5/2006 | Walther | |
| 2006/0286729 A1 | 12/2006 | Kavalieros | |
| 2007/0108528 A1 | 5/2007 | Anderson | |

(Continued)

FOREIGN PATENT DOCUMENTS

| | | | | |
|---|---|---|---|---|
| EP | 829908 A2 | * | 3/1998 | ............ H01L 29/778 |
| TW | 201125043 A1 | | 7/2011 | |

*Primary Examiner* — Thomas L Dickey
(74) *Attorney, Agent, or Firm* — Winston Hsu; Scott Margo

(57) ABSTRACT

A semiconductor device includes a semiconductor substrate, at least a first fin structure, at least a second fin structure, a first gate, a second gate, a first source/drain region and a second source/drain region. The semiconductor substrate has at least a first active region to dispose the first fin structure and at least a second active region to dispose the second fin structure. The first/second fin structure partially overlapped by the first/second gate has a first/second stress, and the first stress and the second stress are different from each other. The first/second source/drain region is disposed in the first/second fin structure at two sides of the first/second gate.

9 Claims, 6 Drawing Sheets

(56) References Cited

U.S. PATENT DOCUMENTS

| | | |
|---|---|---|
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2010/0308381 A1* | 12/2010 | Luning et al. ............... 257/288 |
| 2011/0063019 A1* | 3/2011 | Chang et al. ............... 327/537 |
| 2011/0260257 A1* | 10/2011 | Jagannathan et al. ........ 257/369 |

* cited by examiner

SEMICONDUCTOR DEVICE HAVING STRAINED FIN STRUCTURE AND METHOD OF MAKING THE SAME

BACKGROUND OF THE INVENTION

1. Field of the Invention

The present invention relates to a semiconductor device and a method for making the same, and more particularly, to a semiconductor device including a channel region having a strained silicon epitaxial layer, and a method for making the same.

2. Description of the Prior Art

With the trend in the industry being towards scaling down the size of metal oxide semiconductor transistors (MOS), three-dimensional or non-planar transistor technology such as multiple gate Field effect transistor (multiple gate FET) technology has been developed to replace the planar MOS transistor. The three-dimensional structure of a multiple gate FET increases the overlapping area between the gate and the fin structure of the silicon substrate, and accordingly, the channel region is more effectively controlled. The drain-induced barrier lowering (DIBL) effect and short channel effect is therefore reduced. In addition, the channel region is longer under the same gate length, and thus the current between the source and the drain is increased.

To meet the design trends with respect to high integration, high performance, low power consumption, and the demand of products, fabricating a novel multiple gate FET to improve the reliability of semiconductor device performance is an important issue in the field.

SUMMARY OF THE INVENTION

An objective of the present invention is to provide a semiconductor device including a channel region having a strained silicon epitaxial layer and a method for making the same to improve the reliability of semiconductor device performance.

According to one exemplary embodiment of the present invention, the method of fabricating a semiconductor device includes the following steps. First, a semiconductor substrate including a first active region and a second active region is provided. Then, at least a first fin structure having a first stress is formed in the first active region, and at least a second fin structure having a second stress different from the first stress is formed in the second active region.

According to another exemplary embodiment of the present invention, the semiconductor device is provided. The semiconductor device includes a semiconductor substrate, at least a first fin structure and at least a second fin structure. The semiconductor substrate includes at least a first active region and at least a second active region. The overall first fin structure disposed in the first active region has a first stress. The overall second fin structure disposed in the second active region has a second stress different from the first stress.

The present invention combines an ion implantation process with a selective epitaxial growth (SEG) process for fabricating the fin structures having the strained silicon epitaxial layer. This method omits the etching/pre-clean steps in the conventional process for fabricating the epitaxial layer; accordingly, the damage to the formed structures can be reduced, and the residual etching solution/chemical solvent adversely affecting the semiconductor device can be prevented as well. In addition, the fin structure having the strained silicon epitaxial layer is further integrated into a metal gate process to provide a novel multiple gate FET which improves the efficiency and performance of the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail herein. The preferred exemplary embodiments of the present invention are illustrated in the accompanying drawings with numbered elements.

Figure 1:
FIG. 1 through FIG. 3 are schematic diagrams illustrating a method for forming a fin structure according to an exemplary embodiment of the present invention.
Figure 1:
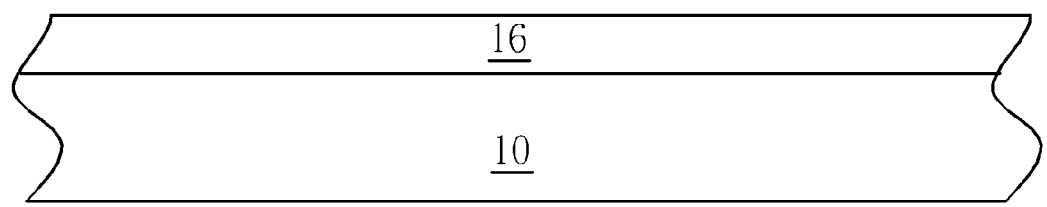
Figure 2:
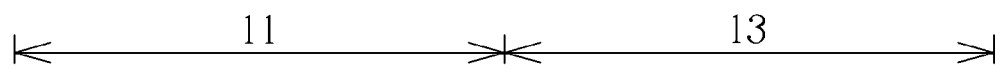
Figure 2:
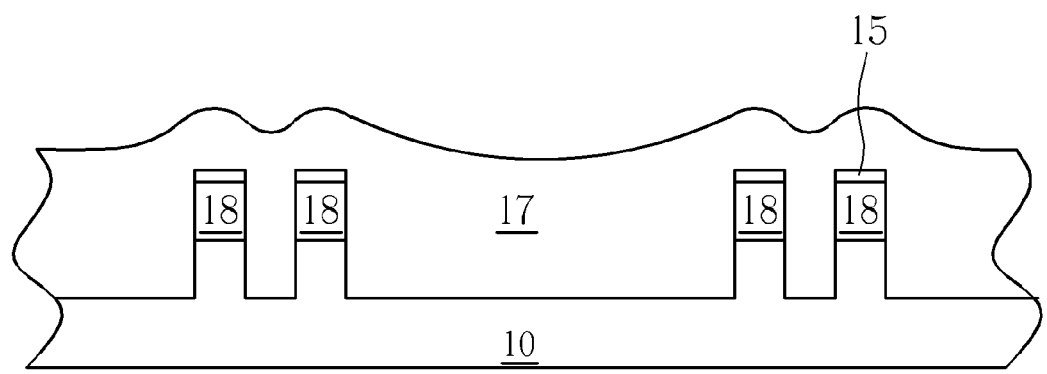
Figure 3:
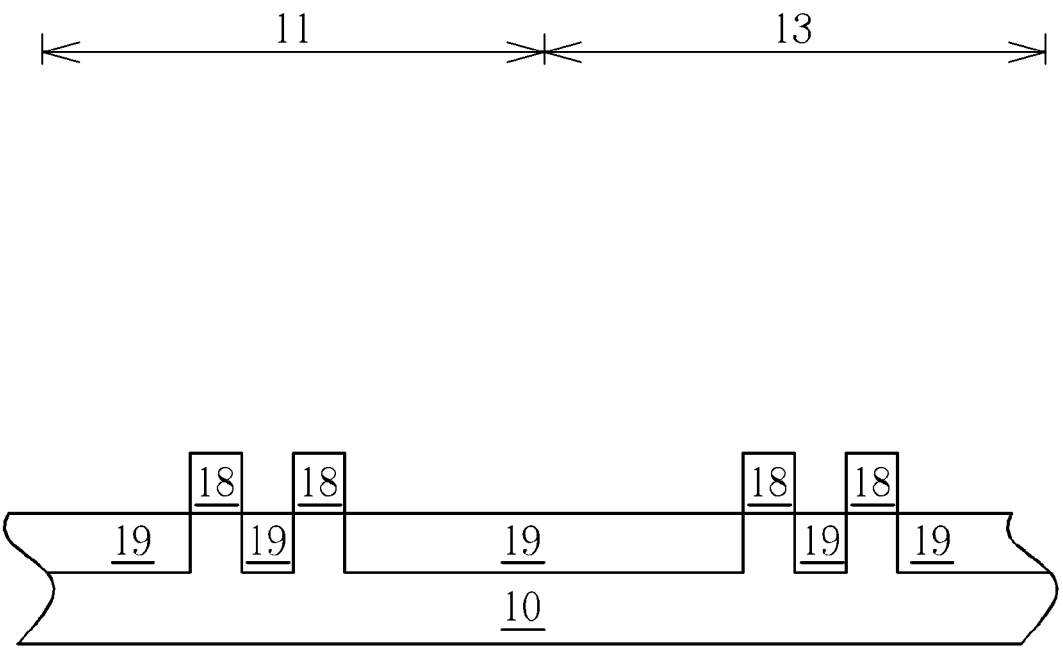

Please refer to FIG. 1 through FIG. 3. FIG. 1 through FIG. 3 are schematic diagrams illustrating a method for forming a fin structure according to an exemplary embodiment of the present invention. As shown in FIG. 1, a semiconductor substrate 10 is provided. The semiconductor substrate 10 may include a bulk silicon substrate, and at least two active regions including a first active region and a second active region, for example, an n-type metal oxide semiconductor transistor (NMOS) region 11 and a p-type metal oxide semiconductor transistor (PMOS) region 13 are defined thereon. Additionally, the semiconductor substrate 10 may include other kinds of substrates such as a silicon-on-insulator (SOI) substrate to provide superior ground connection and thermal dissipation for reducing interference and cost.

A selective epitaxial growth (SEG) process is performed to entirely form a semiconductor layer 16 on the semiconductor substrate 10. The material of the semiconductor layer 16 has at least two kinds of 4A group elements, and the composition can be denoted as silicon-germanium-carbon ($Si_{(1-x-y)}Ge_xC_y$), in which x and y are zero or a positive number between 0 and 1 respectively. By taking advantage of the lattice constant of SiGeC layer being different from that of Si, a stress may occur in the semiconductor layer 16 to form a strained silicon epitaxial layer. The band structure of Si is altered so that the mobility of the carriers including electrons or holes is increased, thus attaining the higher performance of a semiconductor device. Additionally, before the SEG process, the present invention may selectively include an ion implantation process performed on the semiconductor substrate 10, in which the dopant includes 4A group elements such as carbon (C), germanium (Ge) or a combination of at least two 4A group elements.

Subsequently, the stress status of the NMOS region 11/PMOS region 13 is modified according to the device characteristics. The present invention at least includes the following exemplary embodiments.

The First Exemplary Embodiment

The entirely formed semiconductor layer 16 includes ($Si_{(1-x-y)}Ge_xC_y$), and the ratio of y to x is larger than 0.1, i.e.

y>0.1x. The semiconductor layer 16 has an original tensile stress. In this exemplary embodiment, a patterned mask (not shown) is used to cover the NMOS region 11 and expose the PMOS region 13. Furthermore, an ion implantation process with the dopant of 4A group elements including Ge is performed for modifying the semiconductor layer 16 in the PMOS region 13. Consequently, the semiconductor layer 16 in the PMOS region 13 may be changed to include $(Si_{(1-x-y)}Ge_xC_y)$ and y<0.1x; that is, the strained silicon epitaxial layer will have a compressive stress instead of the tensile stress. Afterwards, the patterned mask is removed.

The Second Exemplary Embodiment

The entirely formed semiconductor layer 16 includes $(Si_{(1-x-y)}Ge_xC_y)$, and the ratio of y to x is smaller than 0.1, i.e. y<0.1x. The semiconductor layer 16 has an original compressive stress. In this exemplary embodiment, a patterned mask (not shown) is used to cover the PMOS region 13 and expose the NMOS region 11. Furthermore, an ion implantation process with the dopant of 4A group elements including C is performed for modifying the semiconductor layer 16 in the NMOS region 11. Consequently, the semiconductor layer 16 in the NMOS region 11 may be changed to include $(Si_{(1-x-y)}Ge_xC_y)$ and y>0.1x; that is, the strained silicon epitaxial layer will have a tensile stress instead of the compressive stress. Afterwards, the patterned mask is removed.

The Third Exemplary Embodiment

The entirely formed semiconductor layer 16 includes $(Si_{(1-x-y)}Ge_x)$, i.e. the semiconductor layer 16 has original compressive stress. In this exemplary embodiment, a patterned mask (not shown) is used to cover the PMOS region 13 and expose the NMOS region 11. Furthermore, an ion implantation process with the dopant of 4A group elements including C is performed for modifying the semiconductor layer 16 in the NMOS region 11. Consequently, the semiconductor layer 16 in the NMOS region 11 may be changed to include $(Si_{(1-x-y)}Ge_xC_y)$ and y>0.1x; that is, the strained silicon epitaxial layer will have a tensile stress instead of the compressive stress. Afterwards, the patterned mask is removed.

The Fourth Exemplary Embodiment

The entirely formed semiconductor layer 16 includes $(Si_{(1-y)}C_y)$, i.e. the semiconductor layer 16 has an original tensile stress. In this exemplary embodiment, a patterned mask (not shown) is used to cover the NMOS region 11 and expose the PMOS region 13. Furthermore, an ion implantation process with the dopant of 4A group elements including Ge is performed for modifying the semiconductor layer 16 in the PMOS region 13. Consequently, the semiconductor layer 16 in the PMOS region 13 may be changed to include $(Si_{(1-x-y)}Ge_xC_y)$ and y<0.1x; that is, the strained silicon epitaxial layer becomes to have a compressive stress instead of the tensile stress. Afterwards, the patterned mask is removed.

The Fifth Exemplary Embodiment

The entirely formed semiconductor layer 16 includes Si. In this exemplary embodiment, a patterned mask (not shown) is used to cover the NMOS region 11 and expose the PMOS region 13. Furthermore, an ion implantation process with the dopant of 4A group elements including Ge is performed for modifying the semiconductor layer 16 in the PMOS region 13. Consequently, the semiconductor layer 16 in the PMOS region 13 may be changed to include $(Si_{(1-x-y)}Ge_xC_y)$ and y<0.1x; that is, the strained silicon epitaxial layer will have a compressive stress. After removing the said patterned mask, another patterned mask (not shown) is used to cover the PMOS region 13 and expose the NMOS region 11. Furthermore, an ion implantation process with the dopant of 4A group elements including C is performed for modifying the semiconductor layer 16 in the NMOS region 11. Consequently, the semiconductor layer 16 in the NMOS region 11 may be changed to include $(Si_{(1-x-y)}Ge_xC_y)$ and y>0.1x; that is, the strained silicon epitaxial layer will have a tensile stress. Afterwards, the patterned mask is removed.

The Sixth Exemplary Embodiment

Before the SEG process, the present invention may selectively include an ion implantation process performed on the semiconductor substrate 10, and the dopant includes 4A group elements such as carbon (C), germanium (Ge) or a combination of at least two 4A group elements For example, a patterned mask (not shown) is used to cover the NMOS region 11 and expose the PMOS region 13. Furthermore, an ion implantation process with the dopant of 4A group elements including Ge is performed for modifying the semiconductor layer 16 in the PMOS region 13. Consequently, the semiconductor layer 16 in the PMOS region 13 may be changed to include $(Si_{(1-x)}Ge_x)$ or $(Si_{(1-x-y)}Ge_xC_y)$ with y<0.1x; that is, the strained silicon epitaxial layer has a compressive stress herein. Similarly, after removing the said patterned mask, another patterned mask (not shown) is used to cover the PMOS region 13 and expose the NMOS region 11. Furthermore, an ion implantation process with the dopant of 4A group elements including C is performed for modifying the semiconductor layer 16 in the NMOS region 11. Consequently, the semiconductor layer 16 in the NMOS region 11 may be changed to include $(Si_{(1-y)}C_y)$ or $(Si_{(1-x-y)}Ge_xC_y)$ with y>0.1x; that is, the strained silicon epitaxial layer will have a tensile stress. Afterwards, the patterned mask is removed.

In other words, the present invention utilizes a SEG process and an ion implantation process with the dopant of 4A group elements to entirely form the semiconductor layer 16 on the semiconductor substrate 10. The material of the semiconductor layer 16 has at least two kinds of 4A group elements, and the composition ratio could be denoted as $(Si_{(1-x-y)}Ge_xC_y)$, in which x and y are zero or a positive number between 0 and 1. On the semiconductor substrate 10, the semiconductor layer 16 in the NMOS region 11 and the semiconductor layer 16 in the PMOS region 13 have different values of x and y. For example, as the mole fraction (y) of carbon is substantially larger than one tenth of the mole fraction (x) of germanium in the semiconductor layer 16, i.e. y>0.1x, the lattice constant of the semiconductor layer 16 is smaller than that of silicon. Accordingly, the epitaxial layer may have a tensile stress for further serving as a strained silicon epitaxial layer used in the channel region of NMOS to improve the driven current status. Analogically, as the mole fraction (y) of carbon is substantially smaller than one tenth of the mole fraction (x) of germanium in the semiconductor layer 16, i.e. y<0.1x, the lattice constant of the semiconductor layer 16 is larger than that of silicon. Accordingly, the epitaxial layer may have a compressive stress for further serving as a strained silicon epitaxial layer used in the channel region of PMOS to improve the driven current status.

Afterwards, a portion of the semiconductor layer is etched to form the fin structures on the semiconductor substrate. As shown in FIG. 2, at first, a patterned hard mask 15 is formed on the semiconductor layer 16 for defining at least a fin structure 18. Then, an etching process is performed to remove a portion of the semiconductor layer 16 and a portion of the semiconductor substrate 10 for simultaneously forming a plurality of the fin structures 18 and shallow trenches disposed between the fin structures 18. Subsequently, through a high density plasma CVD (HDPCVD) process, a sub atmosphere CVD (SACVD) process or a spin on dielectric (SOD) process, a dielectric layer 17 covering the fin structures 18 and filling the shallow trenches is formed on the semiconductor substrate 10. As shown in FIG. 3, a chemical mechanical polishing (CMP) process is performed to planarize the dielectric layer 17, and an etching process is performed to remove the patterned hard mask 15 and a portion of the dielectric layer 17 to form the shallow trench isolation 19 in the semiconductor substrate 10 between each of the fin structures 18.

It should be appreciated that the order of the ion implantation process and the patterning process of the semiconductor layer are not limited thereto. For example, the semiconductor layer 16 can be formed firstly, and the patterning process for defining at least a fin structure 18 is then performed. After that, the ion implantation processes illustrated in the previous exemplary embodiments are performed to respectively modify the composition ratio denoted as $(Si_{(1-x-y)}Ge_xC_y)$. That is, the ion implantation process with the 4A group elements could be overall/locally performed in the semiconductor substrate/the fin structures.

Figure 4:
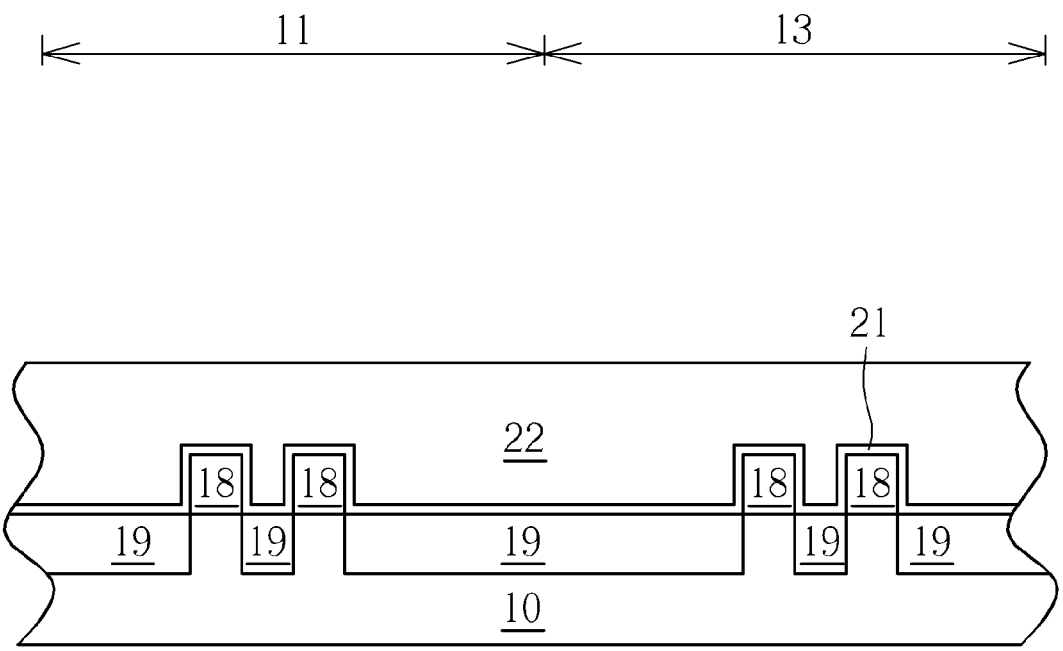
FIG. 4 through FIG. 9 are schematic diagrams illustrating a method for forming a semiconductor device according to an exemplary embodiment of the present invention.
Figure 5:
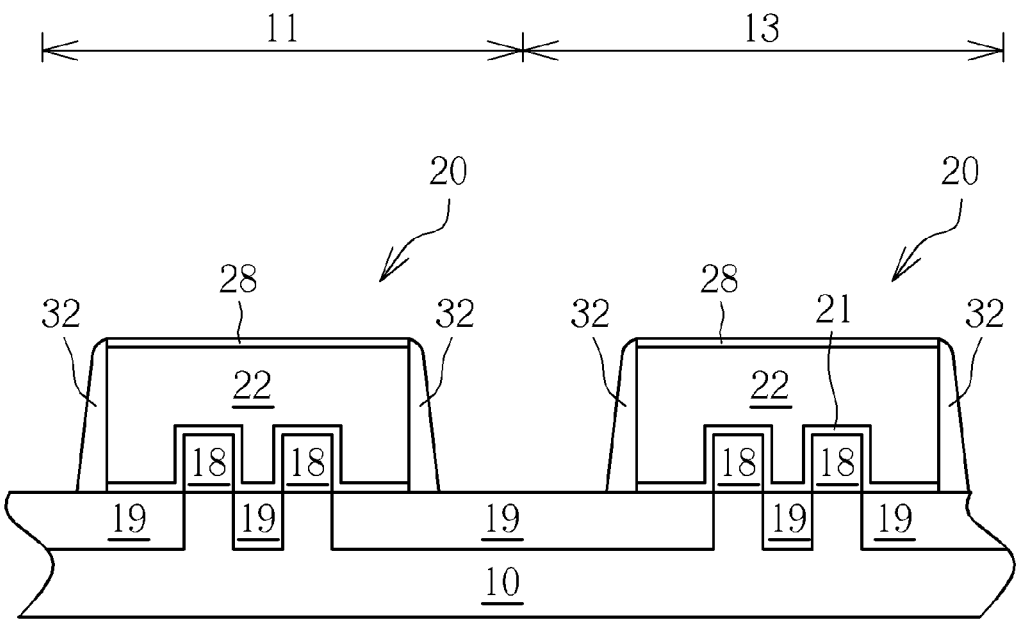

Various semiconductor processes such as MOS process including the polysilicon gate or metal gate are also performed. The illustrated process for fabricating the fin structures accompanying the high-k (high dielectric constant) last process integrated into the gate-last process is taken as an exemplary embodiment herein. Please refer to FIG. 4 through FIG. 9. FIG. 4 through FIG. 9 are schematic diagrams illustrating a method for forming a semiconductor device according to an exemplary embodiment of the present invention. As shown in FIG. 4, at first, a dielectric layer 21 and a gate material layer 22 covering the fin structures 18 are formed sequentially on the semiconductor substrate 10. Then, a planarization process is performed on the gate material layer 22. Subsequently, as shown in FIG. 5, a patterned cap layer 28 is formed on the gate material layer 22 for defining the position of each of the gates in the NMOS region 11/the PMOS region 13. The patterned cap layer 28 may serve as a mask layer, as the dielectric layer 21 and the gate material layer 22 are etched to form a plurality of dummy gates 20 partially overlapping the fin structures 18. The extended direction of the dummy gates 20 vertically crosses the extended direction of the fin structures 18. Furthermore, the dummy gates 20 partially overlap the two sides and the top of the fin structures 18. The material of the dielectric layer 21 may include silicon oxide (SiO), silicon nitride (SiN) or silicon oxynitride (SiON). The gate material layer 22 may be made of undoped polysilicon or polysilicon having N+ dopants, and the patterned cap layer 28 disposed on the dummy gates 20 could be composed of silicon nitride (SiN), silicon oxide (SiO) or silicon oxynitride (SiON), but is not limited thereto.

Figure 6:
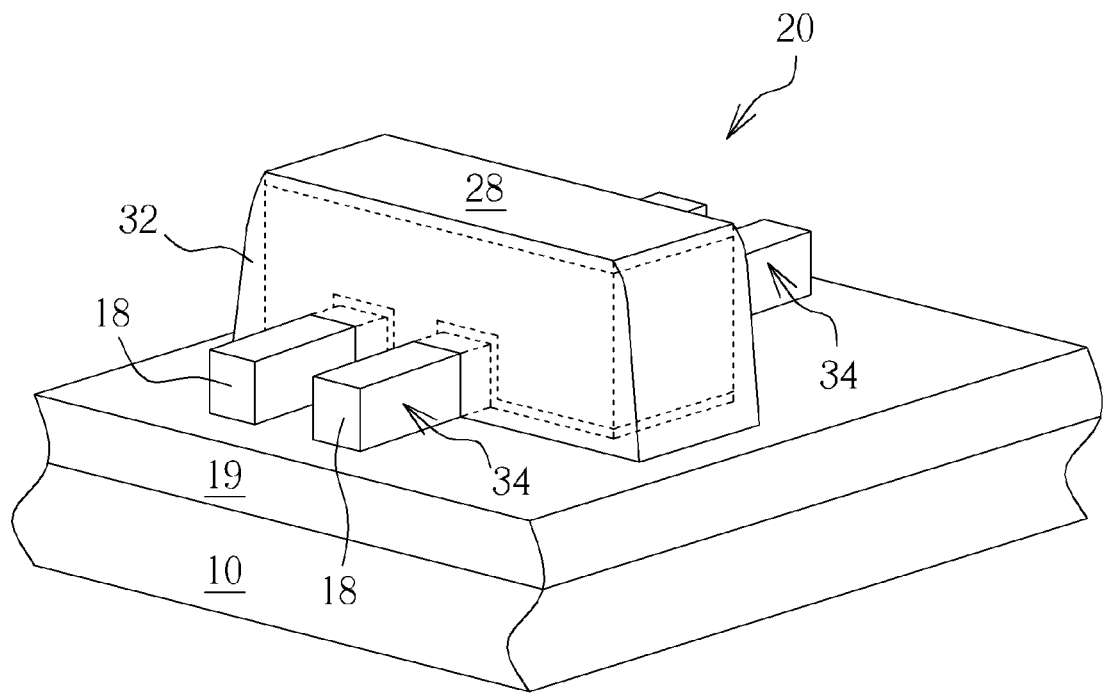

A lightly doped source/drain (not shown) is selectively formed in the fin structure 18 not covered by the dummy gate 20. The spacer 32 is formed on the sidewalls of the dummy gate 20, where the spacer 32 may be a monolayered structure or multilayered structure or may include a liner, or be a composition thereof. The material of the spacer 32 could be high temperature oxide (HTO), silicon nitride, silicon oxide, or HCD-SiN formed by hexachlorodisilane ($Si_2Cl_6$). As the spacer processes are commonly known to those skilled in the art, the details are omitted herein for brevity. As shown in FIG. 6, a source/drain region 34 is formed in the fin structures 18 at both sides of dummy gate 20 through an ion implantation process by using the spacer 32 and the cap layer 28 as a mask and implanting suitable n-type or p-type dopants. Furthermore, an annealing process could be carried out to activate the source/drain region 34. Moreover, despite the light doped source/drain region, the spacer 32, and the source/drain region 34 being formed sequentially in this exemplary embodiment, the order of fabricating the spacer and the doped regions could also be adjusted according to the demands of the product; these modifications are all within the scope of the present invention.

It should be appreciated that the multiple gate Field effect transistor (multiple gate FET) having the polysilicon gate is completed herein. In this exemplary embodiment, there are three contacting surfaces such as two side surfaces and one top surface between the dielectric layer 21 and the fin structure 18, accordingly, the completed multiple gate FET is a tri-gate FET, but not limited thereto. As the illustrated cap layer 15 is still kept between the dielectric layer 21 and the fin structure 18, there are only two contacting surfaces such as two side surfaces between the dielectric layer 21 and the fin structure 18, accordingly, the completed multiple gate FET is a FinFET. The fin structures 18 includes at least two kinds of 4A group elements such as silicon (Si), germanium (Ge), carbon (C), and the composition could be denoted as $(Si_{(1-x-y)}Ge_xC_y)$, in which x and y are zero or a positive number between 0 and 1 respectively. The fin structures 18 partially covered by the dummy gate 20 could serve as the channel region between the source/drain region 34 for improving the driven current status. As the mole fraction (y) of carbon is substantially larger than one tenth of the mole fraction (x) of germanium, i.e. a ratio of y to x is larger than 0.1, y>0.1x, the overall fin structures 18 may have a tensile stress, which can feasibly be used as the channel region of the later formed NMOS. Analogically, as the mole fraction (y) of carbon is substantially smaller than one tenth of the mole fraction (x) of germanium, i.e. a ratio of y to x is smaller than 0.1, y<0.1x, the overall fin structures 18 may have a compressive stress, which can feasibly be used as the channel region of the later formed PMOS. The present invention combines the ion implantation process with the selective epitaxial growth (SEG) process for forming the strained silicon epitaxial layer, and the etching process is performed to form the fin structures. In comparison with the conventional strained silicon transistor process, the present invention omits the etching/pre-clean steps used for forming the recesses predetermined to dispose the epitaxial layer; accordingly, the damage to the formed structures can be reduced, and the residual etching solution/chemical solvent adversely affecting the semiconductor device can be prevented as well.

Figure 7:
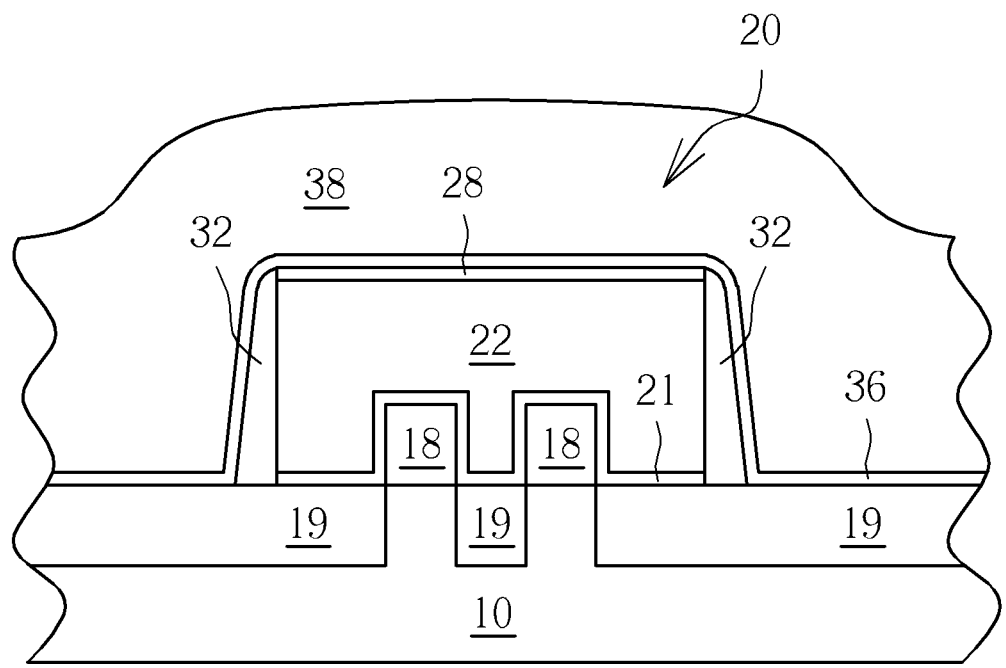

In addition, the high-k last process of the metal gate could be subsequently performed, and a single transistor is taken for example. As shown in FIG. 7, a contact etch stop layer (CESL) 36 and an inter-layer dielectric (ILD) layer 38 deposited sequentially on the semiconductor substrate 10 entirely cover the semiconductor substrate 10. The material of the CESL may include silicon nitride, and the material of the ILD layer may include nitride, oxide, carbide, the low-k material or any combination thereof.

Figure 8:
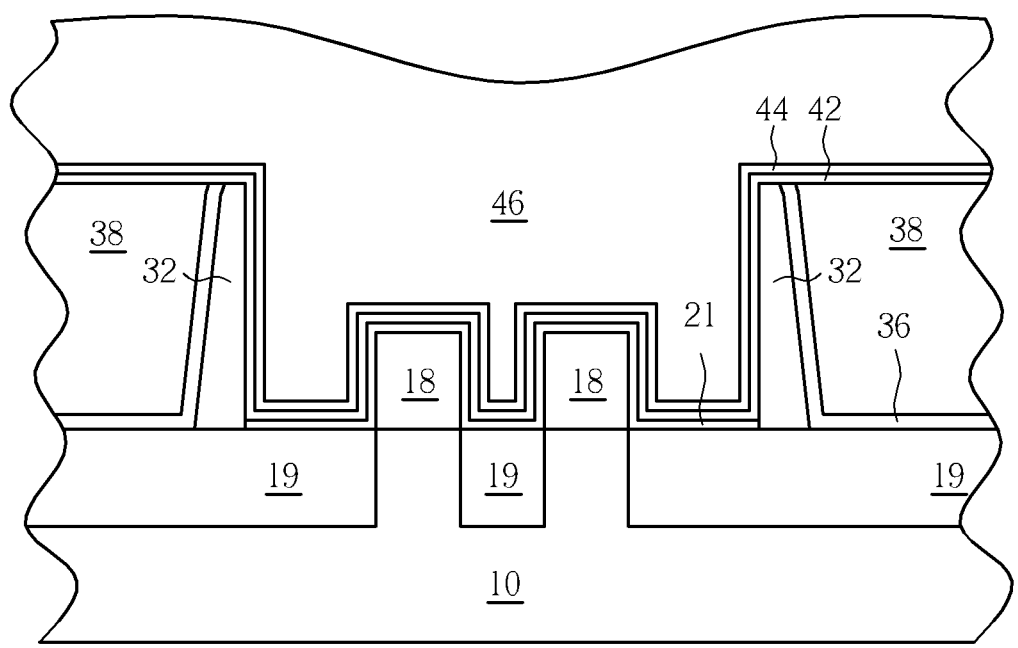

As shown in FIG. 8, a planarization process, such as a chemical mechanical polish (CMP) process or an etching back process, is performed to remove a portion of the ILD layer 38, a portion of the CESL layer 36, a portion of the spacer 32 and all of the cap layer 28 to expose the gate material layer 22. Afterwards, an etching process is performed to remove the gate material layer 22. The etching process includes a selective dry etching process or a wet etching process. In this exemplary embodiment, the gate material layer 22 could be dry-etched by using chlorine gas ($Cl_2$) as an etchant, and thereafter a tetramethyl ammonium hydroxide (TMAH) solution is used as an etchant to remove the residual gate material layer 22, but the invention is not limited thereto. Accordingly, a gate trench (not shown) is formed.

Subsequently, a high-k (high dielectric constant) gate dielectric layer 42 covering the dielectric layer 21, the spacer 32, the CESL layer 36 and the ILD layer 38 is formed in the gate trench. The material of the high-k gate dielectric layer 42 may be hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or any combination thereof. Additionally, before forming the high-k gate dielectric layer 42, a renewal interfacial layer (not shown) could be formed to substitute the dielectric layer 21.

A work function tuning layer 44 is selectively formed on the high-k gate dielectric layer 42 for tuning the work function of the later formed metal gate to be appropriate in an NMOS or PMOS. For an NMOS, the work function tuning layer 44 having a work function ranging between 3.9 eV and 4.3 eV may include titanium aluminide (TiAl), zirconium aluminide (ZrAl), tungsten aluminide (WAl), tantalum aluminide (TaAl), or hafnium aluminide (HfAl), but it is not limited thereto. For a PMOS, the work function tuning layer 44 having a work function ranging between 4.8 eV and 5.2 eV may include titanium nitride (TiN), tantalum nitride (TaN), tantalum carbide (TaC), but it is not limited thereto.

Figure 9:
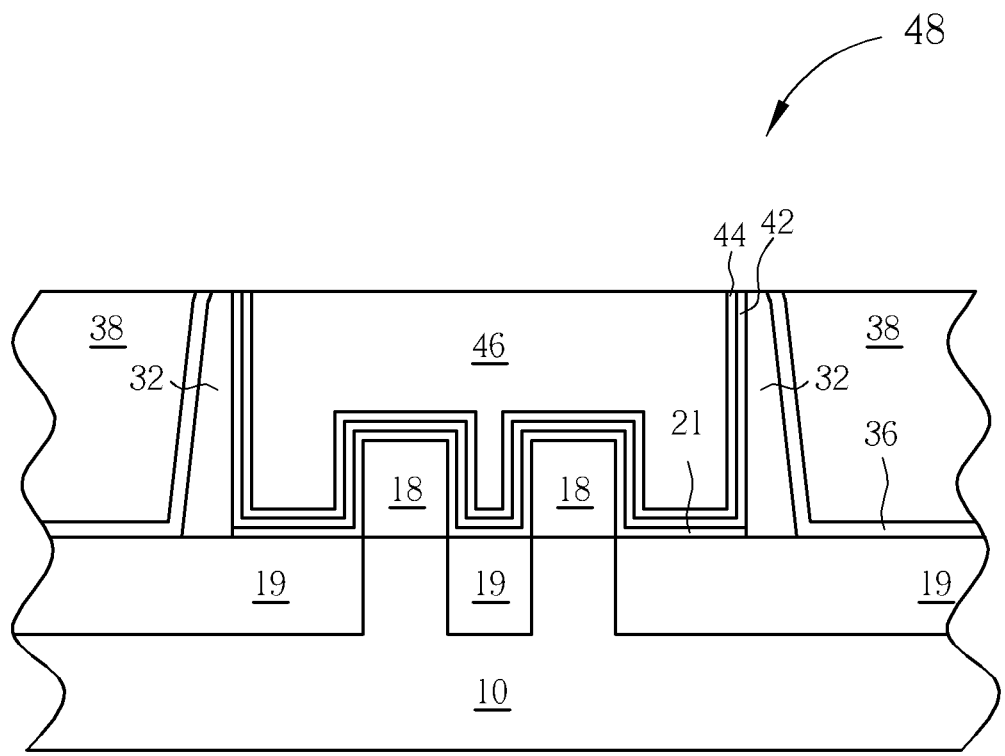

Furthermore, a metal conductive layer 46 formed on the work function tuning layer 44 fills the gate trench. In this exemplary embodiment, the metal conductive layer 46 may include low resistance material such as copper (Cu), aluminum (Al), titanium aluminum (TiAl), cobalt tungsten phosphide (CoWP) or any combination thereof. As shown in FIG. 9, after the formation of the high-k gate dielectric layer 42, the work function tuning layer 44 and the metal conductive layer 46, the other planarization process, such as a CMP process, may be performed to remove a portion of the metal conductive layer 46, a portion of the work function tuning layer 44 and a portion of the high-k gate dielectric layer 42 until the top of the ILD layer 38 is exposed. Consequently, a transistor having a metal gate 48 and the fin structures 18 is fabricated. Moreover, a barrier layer (not shown) is selectively disposed between the high-k gate dielectric layer 42 and the work function tuning layer 44 and between the work function tuning layer 44 and the metal conductive layer 46, and the material of the barrier layer may include titanium (Ti), titanium nitride (TiN), tantalum (Ta) or tantalum nitride (TaN).

Figure 10:
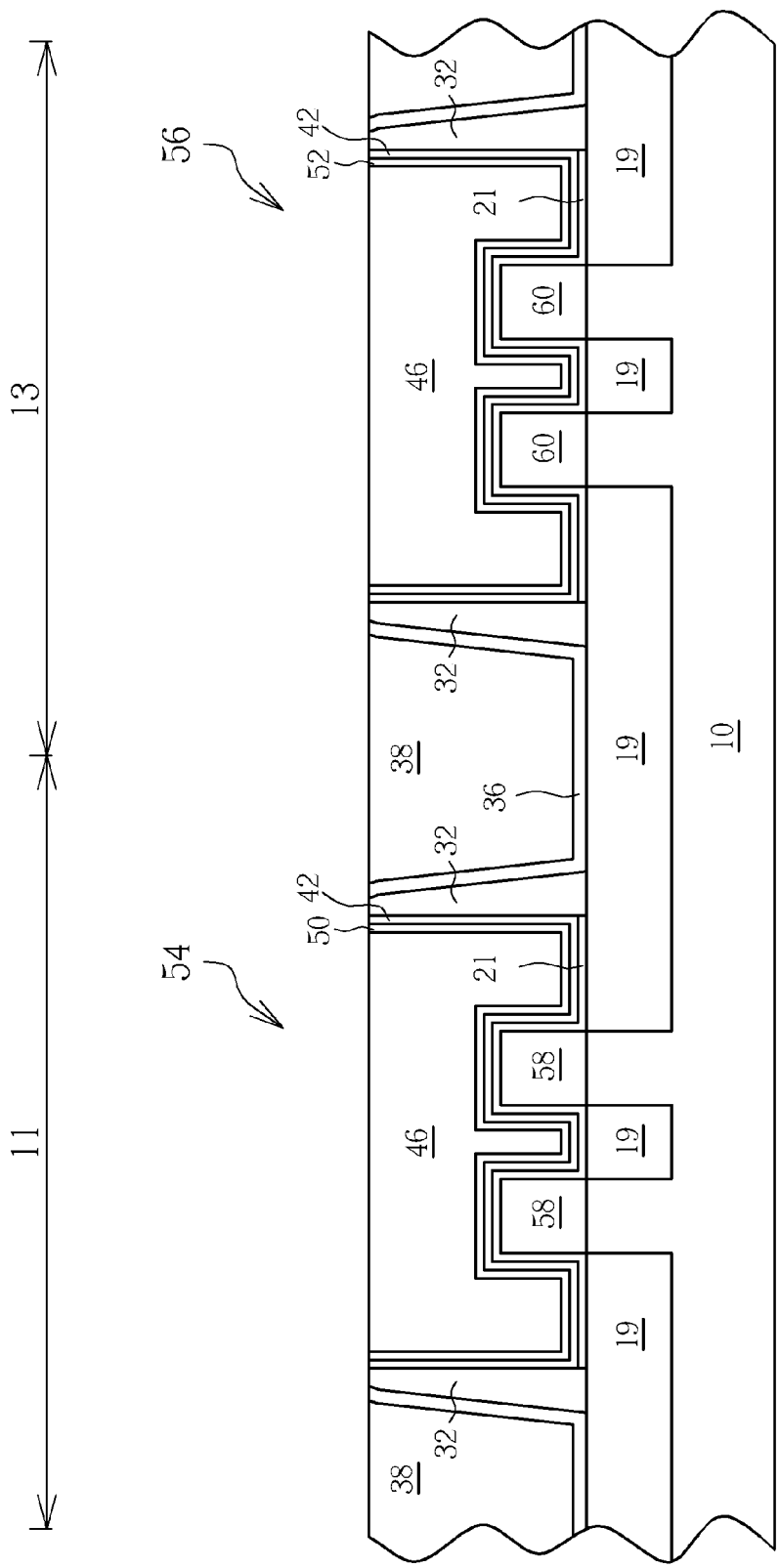
FIG. 10 is a schematic diagram illustrating a semiconductor device according to an exemplary embodiment of the present invention.

Please refer to FIG. 10. FIG. 10 is a schematic diagram illustrating a semiconductor device according to an exemplary embodiment of the present invention. As show in FIG. 10, the semiconductor substrate 10 has at least a first active region 11 and at least a second active region 13. The semiconductor substrate 10 may include a silicon-on-insulator (SOI) substrate or a bulk silicon substrate; in this exemplary embodiment, the bulk silicon substrate is used for explanatory purposes. An n-type metal oxide semiconductor transistor (NMOS) may be disposed in the first active region 11 as the NMOS region, and a p-type metal oxide semiconductor transistor (PMOS) may be disposed in the second active region 13 as the PMOS region, but not the device is limited thereto. At least a first fin structure 58 is disposed in the first active region 11, and at least a second fin structure 60 is disposed in the second active region 13. The material of the first fin structure 58 and the second fin structure 60 may include silicon-germanium-carbon semiconductor material denoted as ($Si_{(1-x-y)}Ge_xC_y$), in which x and y are zero or a positive number between 0 and 1 respectively. Specifically, the material of the overall first fin structure 58 has a ratio of y to x larger than 0.1, i.e. y>0.1x; therefore, the overall first fin structure 58 has a tensile stress within. The entire first fin structure 58 is made of the same material. Furthermore, the material of the overall second fin structure 60 has a ratio of y to x smaller than 0.1, i.e. y<0.1x; therefore, the overall second fin structure 60 has a compressive stress within. The entire second fin structure 60 is made of the same material. Additionally, a first gate 54 partially overlaps the first fin structures 58, and a second gate 56 partially overlaps the second fin structure 60. The first gate 54 includes the high-k gate dielectric layer 42, a first work function tuning layer 50 and the metal conductive layer 46. The second gate 56 includes the high-k gate dielectric layer 42, a second work function tuning layer 52 and the metal conductive layer 46. The materials of the first work function tuning layer 50 and the second work function tuning layer 52 are respectively selected to meet the demands of NMOS and PMOS as illustrated before. Additionally, the first work function tuning layer 50 and the work function tuning layer 52 may be a single layer structure or a multilayer structure. In the first active region 11 (NMOS region), a first source/drain region (not shown) is disposed in the first fin structure 58 at two sides of the first gate 54. In the second active region 13 (PMOS region), a second source/drain region (not shown) is disposed in the second fin structure 60 at two sides of the second gate 56. The configuration of the first gate 54, the second gate 56, the first fin structure 58, the second fin structure 60 and the source/drain regions are shown in FIG. 6. As shown in the diagram, the extended direction of the dummy gates 20 vertically crosses the extended direction of the fin structures 18; accordingly, the source/drain regions herein are disposed on the fin structures extending along a direction vertical to the surface.

In conclusion, the present invention combines an ion implantation process with a selective epitaxial growth (SEG) process for fabricating fin structures having a strained silicon epitaxial layer. This method omits the etching/pre-clean steps of the conventional process for fabricating the epitaxial layer; accordingly, the damage to the formed structures can be reduced, and the residual etching solution/chemical solvent adversely affecting the semiconductor device can be prevented as well. In addition, the fin structure having the strained silicon epitaxial layer is further integrated into a metal gate process to provide a novel multiple gate FET to improve the efficiency and performance of the semiconductor device.

Those skilled in the art will readily observe that numerous modifications and alterations of the device and method may be made while retaining the teachings of the invention.

What is claimed is:
1. A method for forming a semiconductor device, comprising:
    providing a semiconductor substrate comprising a first active region and a second active region;
    forming a semiconductor layer having a first stress on the semiconductor substrate;

performing an ion implantation process to modify the semiconductor layer in the second active region to have a second stress;

patterning the semiconductor layer for forming at least a first fin structure in the first active region, wherein the overall first fin structure has the first stress; and patterning the semiconductor layer for forming at least a second fin structure in the second active region, wherein the overall second fin structure has the second stress different from the first stress.

2. The method for forming a semiconductor device according to claim 1, further comprising:

forming a first gate partially overlapping the first fin structure;

forming a second gate partially overlapping the second fin structure;

forming a first source/drain region in the first fin structure at two sides of the first gate; and forming a second source/drain region in the second fin structure at two sides of the second gate.

3. The method for forming a semiconductor device according to claim 2, wherein at least one of the first gate and the second gate comprises a metal gate.

4. The method for forming a semiconductor device according to claim 1, wherein each of the fin structures comprises a silicon-germanium-carbon material denoted as ($Si_{(1-x-y)}Ge_xC_y$), wherein x and y are positive numbers between 0 and 1 respectively.

5. The method for forming a semiconductor device according to claim 4, wherein the first active region comprises an n-type metal oxide semiconductor transistor (NMOS) region, and the material of the overall first fin structure comprises a ratio of y to x larger than 0.1.

6. The method for forming a semiconductor device according to claim 4, wherein the second active region comprises a p-type metal oxide semiconductor transistor (PMOS) region, and the material of the overall second fin structure comprises a ratio of y to x smaller than 0.1.

7. The method for forming a semiconductor device according to claim 1, wherein the ion implantation process is performed after patterning the semiconductor layer.

8. The method for forming a semiconductor device according to claim 1, wherein the semiconductor layer comprises silicon, silicon-germanium-carbon ($Si_{(1-x-y)}Ge_xC_y$), silicon-carbon ($Si_{(1-y)}C_y$) or silicon-germanium ($Si_{(1-x)}Ge_x$), wherein x and y are zero or a positive number between 0 and 1 respectively.

9. The method for forming a semiconductor device according to claim 1, wherein the semiconductor substrate comprises a silicon-on-insulator (SOI) substrate or a bulk silicon substrate.

* * * * *